(12) United States Patent
Yamane et al.

(10) Patent No.: US 12,279,513 B2
(45) Date of Patent: Apr. 15, 2025

(54) FOLDABLE DISPLAY

(71) Applicant: SHARP KABUSHIKI KAISHA, Osaka (JP)

(72) Inventors: Yu Yamane, Sakai (JP); Mayuko Sakamoto, Sakai (JP); Tokio Taguchi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 701 days.

(21) Appl. No.: 17/598,802

(22) PCT Filed: Mar. 25, 2020

(86) PCT No.: PCT/JP2020/013450
§ 371 (c)(1),
(2) Date: Sep. 27, 2021

(87) PCT Pub. No.: WO2020/203584
PCT Pub. Date: Oct. 8, 2020

(65) Prior Publication Data
US 2022/0199923 A1    Jun. 23, 2022

(51) Int. Cl.
*H10K 77/10*      (2023.01)
*B32B 7/12*       (2006.01)
*B32B 15/08*      (2006.01)
*B32B 27/32*      (2006.01)
*B32B 27/34*      (2006.01)
(Continued)

(52) U.S. Cl.
CPC .............. *H10K 77/111* (2023.02); *B32B 7/12* (2013.01); *B32B 15/08* (2013.01); *B32B 27/32* (2013.01); *B32B 27/34* (2013.01); *B32B 27/36* (2013.01); *H10K 59/40* (2023.02); *B32B 2307/42* (2013.01); *B32B 2307/54* (2013.01); (Continued)

(58) Field of Classification Search
CPC ................. H10K 77/111; H10K 59/40; H10K 2102/311; B32B 7/12; B32B 15/08; B32B 27/32; B32B 27/34; B32B 27/36; B32B 2307/42; B32B 2307/54; B32B 2307/56; B32B 2457/208
See application file for complete search history.

(56) References Cited

U.S. PATENT DOCUMENTS 11,048,295 B1 *  6/2021  Smeeton ................. G09F 9/301
11,296,286 B2 *  4/2022  Seo ....................... H10K 77/111
(Continued)

FOREIGN PATENT DOCUMENTS

WO      2016/080239 A1    5/2016

*Primary Examiner* — David Vu
*Assistant Examiner* — Brandon C Fox
(74) *Attorney, Agent, or Firm* — ScienBiziP, P.C.

(57) ABSTRACT

A foldable display, includes a display layer with flexibility including a first display region, a second display region, and a third display region located between the first display region and the second display region; a cover with flexibility configured to cover the display layer; a first support substrate with inflexibility configured to support the first display region; a second support substrate with inflexibility configured to support the second display region; a bending part capable of bending including the third display region; and a shock absorbing layer provided between the display layer and the first support substrate and between the display layer and the second support substrate.

20 Claims, 18 Drawing Sheets

(51) Int. Cl.
  *B32B 27/36* (2006.01)
  *H10K 59/40* (2023.01)
  *H10K 102/00* (2023.01)

(52) U.S. Cl.
  CPC ..... *B32B 2307/56* (2013.01); *B32B 2457/208* (2013.01); *H10K 2102/311* (2023.02)

(56) References Cited

U.S. PATENT DOCUMENTS

| | | |
|---|---|---|
| 2017/0153668 A1 | 6/2017 | Jang et al. |
| 2017/0322598 A1 | 11/2017 | Fujimoto |
| 2020/0194724 A1* | 6/2020 | Ahn ..................... H10K 50/865 |
| 2020/0260597 A1* | 8/2020 | Yoon ................... H05K 5/0226 |
| 2021/0136933 A1* | 5/2021 | Smeeton ................ B32B 15/06 |
| 2021/0168929 A1* | 6/2021 | Wang .................... H05K 1/028 |

\* cited by examiner

| MEMBER | THICKNESS (um) | SHOCKING ABSORBING STRUCTURE | | | | | |
|---|---|---|---|---|---|---|---|
| ADHESIVE LAYER 17 | 1~30 | YES | YES | - | YES | YES | YES |
| PLASTIC FILM 16 | 10~80 | YES | YES | - | YES | YES | YES |
| ADHESIVE LAYER 15 | 0~20 | YES | YES | - | YES | YES | YES |
| METAL FILM 14 | 10~100 | 200 um | <100 um | 50 um | YES | YES GLASS 50 μm | - |
| ADHESIVE LAYER 13 | 0~100 | - | - | YES | YES | YES | YES |
| PLASTIC FILM 12 | 10~100 | - | - | YES | YES | YES | YES |
| FALLING BALL TEST RESULT OF 100 g STAINLESS STEEL BALL | | 5 cm NG | 5 cm OK | 5 cm NG | 15 cm OK | 5 cm NG | 5 cm NG |

|  | SAMPLE 1 | SAMPLE 2 | SAMPLE 3 | SAMPLE 4 | SAMPLE 5 |
| --- | --- | --- | --- | --- | --- |
| METAL FILM 14 | 50 μm | 100 μm | 200 μm | 300 μm | 400 μm |
| FALLING BALL TEST RESULT OF 100 g STAINLESS STEEL BALL | 5 cm OK 10 cm NG | 5 cm OK 10 cm NG | 5 cm NG | 5 cm NG | 5 cm NG |

FIG. 18

|  |  | SAMPLE 6 | SAMPLE 7 | SAMPLE 8 | SAMPLE 9 |
|---|---|---|---|---|---|
| ADHESIVE LAYER 15 | MATERIAL | ACRYLIC | ACRYLIC | ACRYLIC | ACRYLIC |
|  | THICKNESS | 15 μm | 15 μm | 15 μm | 15 μm |
| METAL FILM 14 | THICKNESS | 30 μm | 50 μm | 30 μm | 50 μm |
| ADHESIVE LAYER 13 | MATERIAL | SILICON | SILICON | ACRYLIC | ACRYLIC |
|  | THICKNESS | 25 μm | 25 μm | 15 μm | 15 μm |
| PLASTIC FILM 12 | MATERIAL | POLYESTER | POLYESTER | URETHANE | URETHANE |
|  | THICKNESS | 50 μm | 50 μm | 90 μm | 90 μm |
| FALLING BALL TEST RESULT OF 100 g STAINLESS STEEL BALL | | 20 cm OK | 10 cm OK 15 cm NG | 5 cm OK 10 cm NG | 5 cm NG |

FIG. 19

| | | SAMPLE 10 | SAMPLE 11 | SAMPLE 12 | SAMPLE 13 | SAMPLE 14 | SAMPLE 15 | SAMPLE 16 | SAMPLE 17 |
|---|---|---|---|---|---|---|---|---|---|
| ADHESIVE LAYER 15 | MATERIAL | ACRYLIC 1 | ACRYLIC 2 | ACRYLIC 3 | ACRYLIC 3 | ACRYLIC 4 | ACRYLIC 4 | ACRYLIC 5 | ACRYLIC 6 |
| | THICKNESS | 5 μm | 5 μm | 5 μm | 15 μm | 5 μm | 2 μm | 5 μm | 5 μm |
| ADHESIVE LAYER 13 | MATERIAL | ACRYLIC 3 | ACRYLIC 3 | ACRYLIC 3 | ACRYLIC 3 | ACRYLIC 3 | ACRYLIC 3 | ACRYLIC 3 | ACRYLIC 3 |
| | THICKNESS | 15 μm | 15 μm | 15 μm | 15 μm | 15 μm | 15 μm | 15 μm | 15 μm |
| ADHESIVE LAYER 15 | STORAGE MODULUS | 0.045 MPa | 0.251 MPa | 0.724 MPa | 0.724 MPa | 0.202 MPa | 0.202 MPa | 0.068 MPa | 4.41 MPa |
| | LOSS MODULUS | 0.037 MPa | 0.192 MPa | 0.434 MPa | 0.434 MPa | 0.270 MPa | 0.270 MPa | 0.027 MPa | 1.42 MPa |
| FALLING BALL TEST RESULT OF 100 g STAINLESS STEEL BALL | | 10 cm NG 5 cm OK | 60 cm NG 55 cm OK | 60 cm OK | 10 cm NG 5 cm OK | 60 cm OK | 60 cm OK | 5 cm NG | 45 cm NG 40 cm OK |
| DETERMINATION OF FALLING BALL TEST RESULTS | | MARGINAL | GOOD | EXCELLENT | MARGINAL | EXCELLENT | EXCELLENT | POOR | GOOD |

FIG. 20

| | | SAMPLE 18 | SAMPLE 19 | SAMPLE 20 | SAMPLE 21 | SAMPLE 22 | SAMPLE 23 |
|---|---|---|---|---|---|---|---|
| ADHESIVE LAYER 15 | MATERIAL | ACRYLIC 4 | ACRYLIC 4 | ACRYLIC 4 | ACRYLIC 4 | ACRYLIC 4 | ACRYLIC 4 |
| | THICKNESS | 2 μm | 2 μm | 2 μm | 2 μm | 2 μm | 2 μm |
| ADHESIVE LAYER 13 | MATERIAL | ACRYLIC 1 | ACRYLIC 2 | ACRYLIC 3 | ACRYLIC 3 | ACRYLIC 4 | ACRYLIC 4 |
| | THICKNESS | 5 μm | 5 μm | 25 μm | 5 μm | 5 μm | 2 μm |
| ADHESIVE LAYER 13 | STORAGE MODULUS | 0.045 MPa | 0.251 MPa | 0.724 MPa | 0.724 MPa | 0.202 MPa | 0.202 MPa |
| | LOSS MODULUS | 0.037 MPa | 0.192 MPa | 0.434 MPa | 0.434 MPa | 0.270 MPa | 0.270 MPa |
| FALLING BALL TEST RESULT OF 100 g STAINLESS STEEL BALL | | 60 cm OK | 60 cm OK | 60 cm NG 55 cm OK | 60 cm OK | 60 cm OK | 60 cm OK |
| DETERMINATION OF FALLING BALL TEST RESULTS | | EXCELLENT | EXCELLENT | GOOD | EXCELLENT | EXCELLENT | EXCELLENT |

FIG. 21

| | | SAMPLE 24 | SAMPLE 25 | SAMPLE 26 | SAMPLE 27 |
|---|---|---|---|---|---|
| METAL FILM 14 | MATERIAL | SUS301 | SUS301 | SUS304 | Cu |
| | THICKNESS | 30 μm | 30 μm | 30 μm | 30 μm |
| | SURFACE TREATMENT | SATIN PROCESS | GLOSSY FINISH | - | - |
| | VICKERS HARDNESS | 590 HV | 590 HV | 380 HV~390 HV | 89 HV~110 HV |
| FALL DISTANCE 20 cm | DISPLAY | OK | OK | OK | OK |
| | RECESS | OK | OK | MINUTE | LARGE |
| FALL DISTANCE 25 cm | DISPLAY | OK | OK | OK | NG |
| | RECESS | OK | OK | MINUTE | LARGE |

FIG. 22

FOLDABLE DISPLAY

TECHNICAL FIELD

The disclosure relates to a foldable display.

BACKGROUND ART

Display devices called foldable displays are known. A foldable display is a display device that is able to be folded. An example of a foldable display includes the technology described in PTL 1.

CITATION LIST

Patent Literature

PTL 1: WO 2016/080239 (issued on May 26, 2016)

SUMMARY

Technical Problem

In the foldable display, a cover glass for protecting a display layer cannot be provided because the display layer including the display panel needs to be flexible. Thus, compared to a display device that is not foldable, known-foldable displays are more susceptible to localized impacts on the display layer due to objects being dropped on the display layer, the foldable display being dropped, and the like.

Accordingly, known foldable displays may have disadvantages including display defects caused by a failure of a section that received a localized impact, bright spot or black spot display defects of the display by the display layer caused by a localized impact, and the like.

An aspect of the disclosure is directed at reducing the occurrence of display defects.

Solution to Problem

A foldable display according to an aspect of the disclosure includes: a display layer with flexibility including a first display region, a second display region, and a third display region located between the first display region and the second display region; a cover with flexibility configured to cover the display layer; a first support substrate with inflexibility configured to support the first display region; a second support substrate with inflexibility configured to support the second display region; a bending part capable of bending including the third display region; and a shock absorbing layer provided between the display layer and the first support substrate and between the display layer and the second support substrate.

Advantageous Effects of Disclosure

According to an aspect of the disclosure, the occurrence of display defects can be reduced.

BRIEF DESCRIPTION OF DRAWINGS

FIG. 18 is a table showing the thickness of the metal film constituting the shock absorbing layer of samples of the foldable display of the Comparative example illustrated in FIG. 17 and the results of the shock absorption testing.

FIG. 19 is a table showing the material and the thickness of each member constituting the shock absorbing layer of the samples of the foldable display illustrated in FIG. 1 and the results of the shock absorption testing.

FIG. 20 is a table showing the material and thickness of the adhesive layers constituting the shock absorbing layer of the samples of the foldable display illustrated in FIG. 1, the storage modulus and the loss modulus of the adhesive layer, the results of the shock absorption testing, and the determination of the results of the shock absorption testing.

FIG. 21 is a table showing the material and thickness of the adhesive layers constituting the shock absorbing layer of the samples of the foldable display illustrated in FIG. 1, the storage modulus and the loss modulus of the adhesive layer, the results of the shock absorption testing, and the determination of the results of the shock absorption testing.

FIG. 22 is a table showing the material, the thickness, the surface treatment, and the Vickers hardness of the metal film constituting the shock absorbing layer of the samples of the foldable display illustrated in FIG. 1 and the results of the

DESCRIPTION OF EMBODIMENTS

First Embodiment

Figure 1:
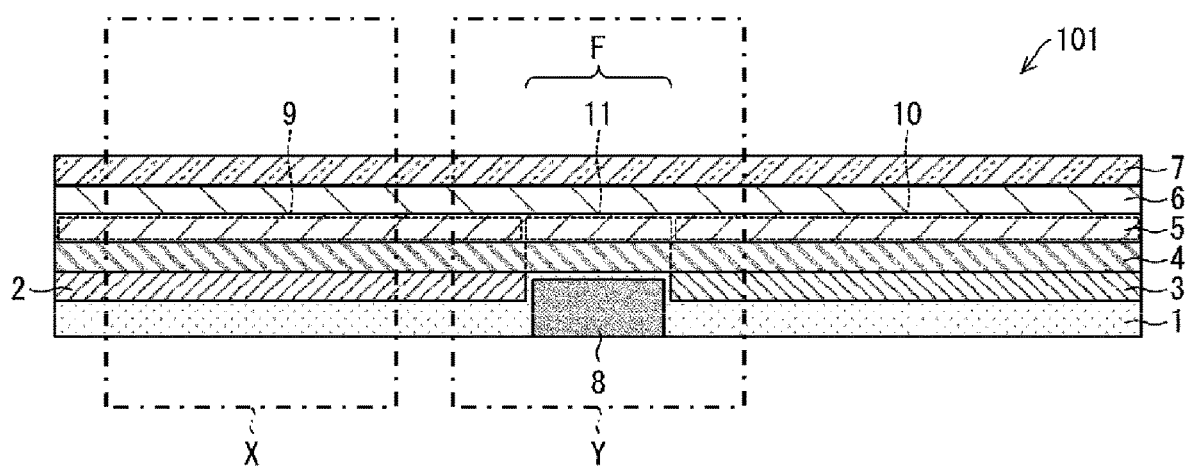
FIG. 1 is a cross-sectional view illustrating a schematic configuration of a foldable display according to an embodiment of the disclosure.

FIG. 1 is a cross-sectional view illustrating a schematic configuration of a foldable display 101 according to an embodiment of the disclosure. The foldable display 101 includes a housing 1, a first support substrate 2, a second support substrate 3, a shock absorbing layer 4, a display layer 5, a function layer 6, a cover 7, and a connection plate 8. In the foldable display 101, the housing 1, the first support substrate 2 and the second support substrate 3, the shock absorbing layer 4, the display layer 5, the function layer 6, and the cover 7 are layered in this order. In the foldable display 101, the connection plate 8 is embedded in the housing 1.

The housing 1 is a housing that is inflexible. However, as described below, the foldable display 101 is foldable because of the connection plate 8 acting as a hinge. The first support substrate 2 and the second support substrate 3 are each substrates that are inflexible and include a battery, a circuit board, and the like. The first support substrate 2 and the second support substrate 3 are separated from one another. The first support substrate 2 and/or the second support substrate 3 are not necessarily provided with a battery, a circuit board, and the like, and the battery, the circuit board, and the like may be provided in the housing 1, for example, at a position separated from the first support substrate 2 and the second support substrate 3.

The display layer 5 is flexible and includes a display panel for performing display. The display panel, for example, is an organic electroluminescent (EL) display panel provided with an organic light-emitting diode (OLED). However, no such limitation is intended. The display panel may be, for example, a quantum dot light emitting diode (QLED) display panel. The display layer 5 can be divided into three regions: a first display region 9, a second display region 10, and a third display region 11. The first display region 9 is defined as a region provided at a position in the thickness direction of the foldable display 101 as seen from the first support substrate 2. In other words, the first support substrate 2 supports the first display region 9. The second display region 10 is defined as a region provided at a position in the thickness direction of the foldable display 101 as seen from the second support substrate 3. In other words, the second support substrate 3 supports the second display region 10. The third display region 11 is defined as a region located between the first display region 9 and the second display region 10 and is a region not supported by either the first support substrate 2 or the second support substrate 3. The third display region 11 may be supported by the connection plate 8.

The function layer 6 is a flexible layer for realizing various functions associated with display by the display layer 5 in the foldable display 101. An example of a function achievable by the function layer 6 is a touch panel function, and, in the present embodiment described, the function layer 6 provides a touch panel function.

The cover 7 is a cover for covering the display layer 5 and protecting the display layer 5. However, the cover 7 needs to be flexible in order for the foldable display 101 to be able to be folded. Specifically, for display devices that are not foldable, a cover for protecting the display layer may be a glass cover with a thickness of approximately a few hundred micrometers. However, the cover 7 needs to be made of a flexible material with a thickness of approximately tens of micrometers. An example of the cover 7 is a known window film that has been subjected to a hardcoating process.

The connection plate 8 is a plate-like member extending in a direction perpendicular to the plane of the paper in FIG. 1. The connection plate 8 acts as a hinge that allows the foldable display 101 to be folded. The connection plate 8 can also function to support a layer above the shock absorbing layer 4. The connection plate 8 is provided at a position in the thickness direction of the foldable display 101 on the opposite side to the third display region 11 as seen from between the first support substrate 2 and the second support substrate 3. In addition, a bending part F is a part that includes the third display region 11 and is capable of bending, and the connection plate 8 supports the bending of the bending part F with the connection plate 8 acting as a pivot. The foldable display 101 is capable of folding, in the direction of the plane of the paper of FIG. 1, at the bending part F with the connection plate 8 acting as a pivot, such that the first display region 9 and the second display region 10 face one another.

The shock absorbing layer 4 is provided for absorbing a localized impact on the foldable display 101. The shock absorbing layer 4 is provided at least between the display layer 5 (first display region 9) and the first support substrate 2, and between the display layer 5 (second display region 10) and the second support substrate 3. In the foldable display 101, the shock absorbing layer 4 is provided between: (1) the display layer 5 (the third display region 11) and (2) between the first support substrate 2 and the second support substrate 3. The shock absorbing layer 4 preferably has a structure that disperses a localized impact over a wide range, as opposed to receiving a localized impact in a narrow range.

When a localized impact is applied to the foldable display 101, the shock is dispersed and absorbed by the shock absorbing layer 4. As a result, the strength of the shock that the display layer 5 actually receives due to the impact is minimized. Accordingly, the occurrence of a display defect caused by a failure of the display layer 5 or bright spot or black spot display defect of the display by the display layer 5 can be reduced.

Figure 2:
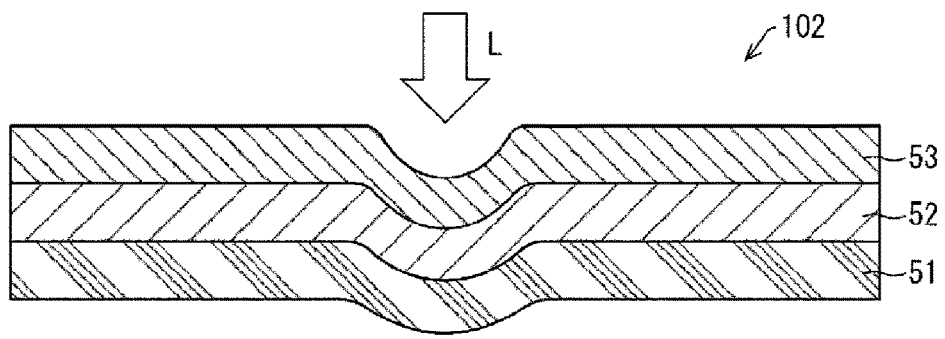
FIG. 2 is a cross-sectional view schematically illustrating a layered structure corresponding to a configuration of the foldable display illustrated in FIG. 1 without a shock absorbing layer, where a localized impact is applied to the layered structure.

FIG. 2 is a cross-sectional view schematically illustrating a layered structure 102 corresponding to a configuration of the foldable display 101 without the shock absorbing layer 4, where a localized impact L is applied to the layered structure 102. The layered structure 102 is a layered structure including a layer structure 51, a display layer 52, and a layer structure 53. The layer structure 51 corresponds a layered structure including the housing 1 and the first support substrate 2 or the second support substrate 3 and is relatively flexible to accommodate the bending of the display layer 52. The display layer 52 corresponds to the display layer 5. The layer structure 53 corresponds a layered structure including the function layer 6 and the cover 7 and is relatively flexible to accommodate the bending of the display layer 52.

When a localized impact L is applied to the layered structure 102 from the layer structure 53 side, the impact L is only applied to the display layer 52 in a localized manner. This may cause display defects due to the failure of the part of the display layer 52 that received the impact L, cracking in the film made of inorganic material that constitutes the display layer 52, bright spot or black spot display defects in the display by the display layer 52, and the like.

Figure 3:
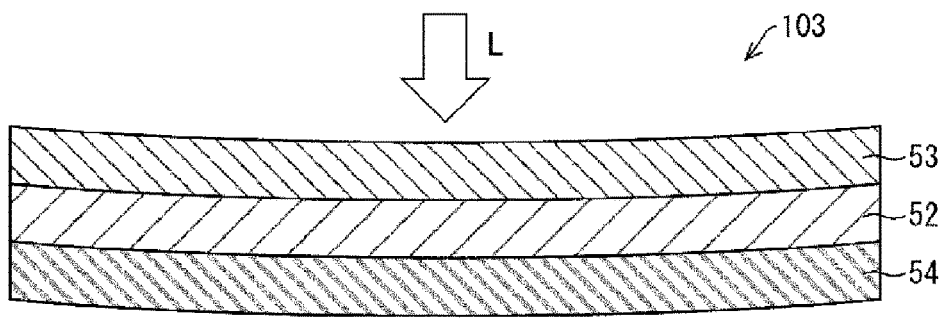
FIG. 3 is a cross-sectional view schematically illustrating a layered structure corresponding to the foldable display illustrated in FIG. 1, where the localized impact is applied to the layered structure.

FIG. 3 is a cross-sectional view schematically illustrating a layered structure 103 corresponding to the foldable display 101, where the localized impact L is applied to the layered structure 103. The configuration of the layered structure 103 is different from that of the layered structure 102 in that the layer structure 51 is replaced with a layer structure 54. The layer structure 54 corresponds to a layered structure including the housing 1, the first support substrate 2 or the second support substrate 3, and the shock absorbing layer 4 and has a better shock dispersing function compared to the layer structure 51.

When a localized impact L is applied to the layered structure 103 from the layer structure 53 side, the impact L is dispersed and absorbed by the layer structure 54. As a result, the strength of the shock that the display layer 52 actually receives due to the impact L is minimized and the shock is distributed in a wider range with the layered structure 103 compared to the layered structure 102. Accordingly, the occurrence of a display defect caused by a failure of the display layer 52 or bright spot or black spot display defect of the display by the display layer 52 can be reduced.

From the foregoing, it can be said that the foldable display 101 has reduced occurrences of display defects.

Figure 4:
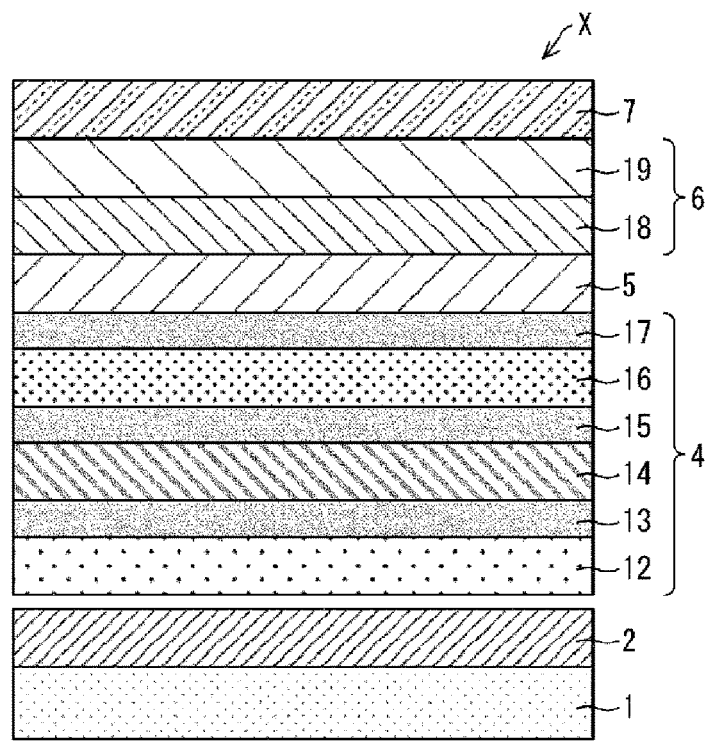
FIG. 4 is a diagram illustrating an example of a range X illustrated in FIG. 1 in more detail.

FIG. 4 is a diagram illustrating an example of a range X illustrated in FIG. 1 in more detail. Specifically, the shock absorbing layer 4 has the following configuration. The shock absorbing layer 4 includes a plastic film (second plastic film) 12, an adhesive layer 13 (second adhesive layer), a metal film 14, an adhesive layer 15 (first adhesive layer), a plastic film (first plastic film) 16, and an adhesive layer 17. In the shock absorbing layer 4, the plastic film 12, the adhesive layer 13, the metal film 14, the adhesive layer 15, the plastic film 16, and the adhesive layer 17 are layered in this order. The function layer 6 more specifically includes a touch panel 18 and a polarizer 19, and the touch panel 18 and the polarizer 19 are layered in this order.

Focusing on the arrangement of the plastic film 16, the plastic film 12, and the metal film 14, the plastic film 16 is provided on the display layer 5 side, the plastic film 12 is provided on the opposite side to the display layer 5, and the metal film 14 is provided between the plastic film 16 and the plastic film 12.

Focusing on the arrangement of the adhesive layer 15 and the adhesive layer 13, the adhesive layer 15 is provided between the plastic film 16 and the metal film 14, and the adhesive layer 13 is provided between the plastic film 12 and the metal film 14.

The metal film 14 mainly has a function of dispersing localized impacts applied to the foldable display 101. Because the metal film 14 deforms locally very little due to the impact, the impact can be dispersed, and the impact strength at each point is reduced due to the dispersion. The metal film 14 preferably includes a material having excellent ductility and, specifically, preferably includes at least one of stainless steel, aluminum, or copper. The thickness of the metal film 14 is preferably from 10 μm to 100 μm, is more preferably from 20 μm to 50 μm, and is even more preferably 30 μm. In order to reduce the deformation of the metal film 14, the Vickers hardness of the metal film 14 is preferably 350 HV or greater, and more preferably 500 HV or greater.

The plastic film 16 mainly has a function of absorbing an impact dispersed by the metal film 14. The plastic film 16 is preferably a film including at least one of polyimide, polyethylene terephthalate (PET), polyethylene naphthalate (PEN), cyclic olefin copolymer (COC), or aramid. The thickness of the plastic film 16 is preferably greater than the thickness of the metal film 14. The plastic film 16 is preferably harder than the plastic film 12.

As with the plastic film 16, the plastic film 12 mainly has a function of absorbing an impact dispersed by the metal film 14. The plastic film 12 is preferably a film including at least one of PET, urethane resin, polyester resin, acrylic resin, or polycarbonate resin. The plastic film 12 may be a foam molded body or may be part of a sheet having a thermal diffusion function. The sheet having a thermal diffusion function may include graphite. The thickness of the plastic film 12 is preferably the same as the thickness of the plastic film 16 or greater than the thickness of the plastic film 16. The plastic film 12 may be a layered structure including a plurality of layers made of different materials.

The Young's modulus of the plastic film 16 is preferably greater than the Young's modulus of the plastic film 12. Specifically, different resin material is preferably selected for the plastic film 12 and the plastic film 16 so that the Young's modulus of the plastic film 16 is greater than the Young's modulus of the plastic film 12. Furthermore, in a case in which the same resin material is used for the plastic film 12 and the plastic film 16, because the Young's modulus is greater the higher the density, the plastic film 16 is preferably a resin material with a higher density than the plastic film 12. For example, the Young's modulus of polyimide is from 2 GPa to 8 GPa, the Young's modulus of PET is 4 GPa, the Young's modulus of PEN is 7 GPa, the Young's modulus of COC is 3 GPa, the Young's modulus of aramid is 10 GPa, the Young's modulus of urethane resin is 0.5 GPa, the Young's modulus of acrylic resin is 3 GPa, and the Young's modulus of polycarbonate resin is 2.3 GPa.

In the foldable display 101, the plastic film 16 makes it difficult for shocks to travel to the display layer 5 side. However, if an impact is applied to the foldable display 101 from the cover 7 side, the plastic film 16 receives the impact before the metal film 14. Thus, the Young's modulus of the plastic film 16 is preferably from 1 GPa to 10 GPa, and the Young's modulus is preferably as high as possible within this range. Accordingly, the impact received by the metal film 14 can be sufficiently dampened, reducing the likelihood that the metal film 14 cannot sufficiently disperse the shock.

The adhesive layer 13 and the adhesive layer 15 may be formed from a self-adhesive agent.

The storage modulus of the adhesive layer 13 is preferably from 0.04 MPa to 0.8 MPa. The loss modulus of the adhesive layer 13 is preferably from 0.03 MPa to 1.5 MPa. The thickness of the adhesive layer 13 is preferably from 1 μm to 25 μm, and more preferably from 1 μm to 10 μm. The material of the adhesive layer 13 is preferably an adhesive with a silicon resin or an acrylic resin as a main component. In particular, it is preferable that both the storage modulus and the loss modulus of the adhesive layer 13 satisfy these preferred conditions.

The storage modulus of the adhesive layer 15 is preferably from 0.04 MPa to 4.5 MPa, and more preferably from 0.2 MPa to 4.5 MPa. The loss modulus of the adhesive layer 15 is preferably from 0.03 MPa to 1.5 MPa, and more preferably from 0.2 MPa to 1.5 MPa. The thinner the thickness of the adhesive layer 15, the greater the falling ball resistance is improved, and thus the thickness of the adhesive layer 15 is preferably from 1 μm to 15 μm, and more preferably from 1 μm to 10 μm. The material of the adhesive layer 15 is preferably an adhesive with an acrylic resin as a main component. In particular, it is preferable that both the storage modulus and the loss modulus of the adhesive layer 15 satisfy these preferred conditions.

The storage modulus of the adhesive layer 17 is preferably from 0.1 MPa to 0.6 MPa, and is preferably as high as possible within this range. The plastic film 16 and the adhesive layer 17 may function as a protection film for protecting the substrate of the display layer 5.

In a case in which the plastic film 12 is formed by applying a liquid material to the metal film 14 or other such cases in which the plastic film 12 and the metal film 14 are able to be adhered together without using an adhesive material, the adhesive layer 13 is not necessary. In a case in which the adhesive layer 15 is used, there is a small amount of air between the plastic film 16 and the metal film 14.

In the foldable display 101, the shock absorbing layer 4 is adhered to the display layer 5, but may be adhered to the first support substrate 2 and the second support substrate 3. In another embodiment, the shock absorbing layer 4 may not be adhered to the first support substrate 2 and the second support substrate 3 with each other, and it is sufficient that the shock absorbing layer 4 is in contact with the first support substrate 2 and the second support substrate 3.

The touch panel 18 is provided between the display layer 5 and the cover 7. In a case in which the display layer 5 and the touch panel 18 are integrally formed by forming the touch panel 18 on the display panel of the display layer 5, it is not necessary to provide an adhesive layer between the display layer 5 and the touch panel 18. The polarizer 19 is constituted by, for example, a polyvinyl alcohol (PVA) polarizing film, a k/4 wavelength plate, and the like.

In the foldable display 101, the two support substrates, the first support substrate 2 and the second support substrate 3, are used. However, three or more support substrates may be used. In addition, in the foldable display 101, there is one bending part F, but there may be two or more bending parts F. The thickness of the plastic film 12 and/or the thickness of the plastic film 16 may be less than the thickness of the metal film 14. Each layer illustrated in FIG. 4 is not necessarily a single layer and may be a layered structure including a plurality of layers.

Furthermore, a thermal diffusion function layer made from graphite, for example, may be provided on the plastic film 12 side as seen from the metal film 14. The thermal diffusion function layer may be provided directly on the plastic film 12 or via an adhesive layer, or may be provided between the metal film 14 and the plastic film 12. By providing the thermal diffusion function layer, heat damage to the light-emitting element (OLED, QLED, or the like) of the display layer 5 can be suppressed due to the thermal diffusion (heat dissipation), and the lifespan of the foldable display 101 can be extended.

Figure 5:
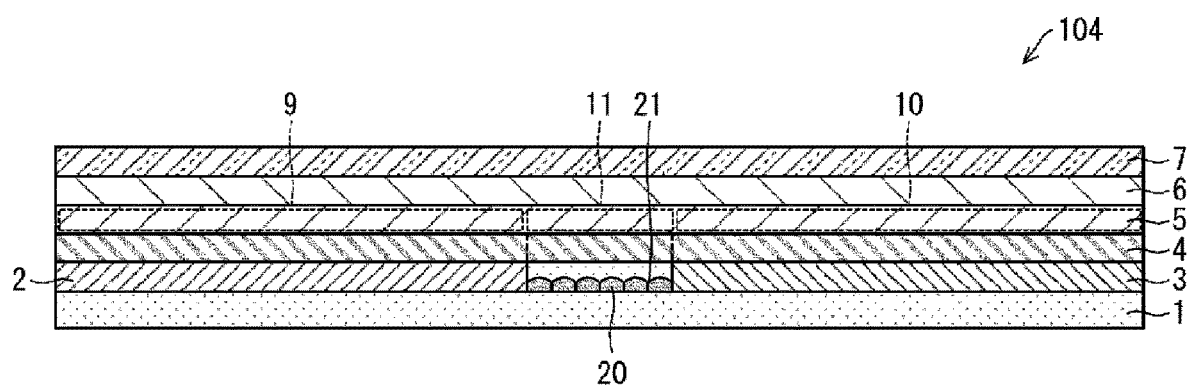
FIG. 5 is a cross-sectional view illustrating a schematic configuration of a foldable display according to a modified example of the disclosure.

FIG. 5 is a cross-sectional view illustrating a schematic configuration of a foldable display 104 according to a modified example of the disclosure. The configuration of the foldable display 104 is different from that of the foldable display 101 in that the connection plate 8 is replaced with a connection plate 20.

The connection plate 20 differs from the connection plate 8 in that the connection plate 20 is disposed between the first support substrate 2 and the second support substrate 3 and a plurality of grooves 21 extending in a direction perpendicular to the plane of the paper in FIG. 5 are formed.

Regarding the foldable display 101, the foldable display 101 has two sections where it folds, the end portion of the connection plate 8 on the first support substrate 2 side and the end portion of the connection plate 8 on the second support substrate 3 side. However, regarding the foldable display 104, the foldable display 104 has six sections where it folds, with each one of the plurality of grooves 21 formed in the connection plate 20 corresponding to a folding section. Thus, compared to the foldable display 101, the foldable display 104 is capable of folding having multiple stages of bending. As described above, various modifications can be made to how the bending part F bends.

Second Embodiment

Figure 6:
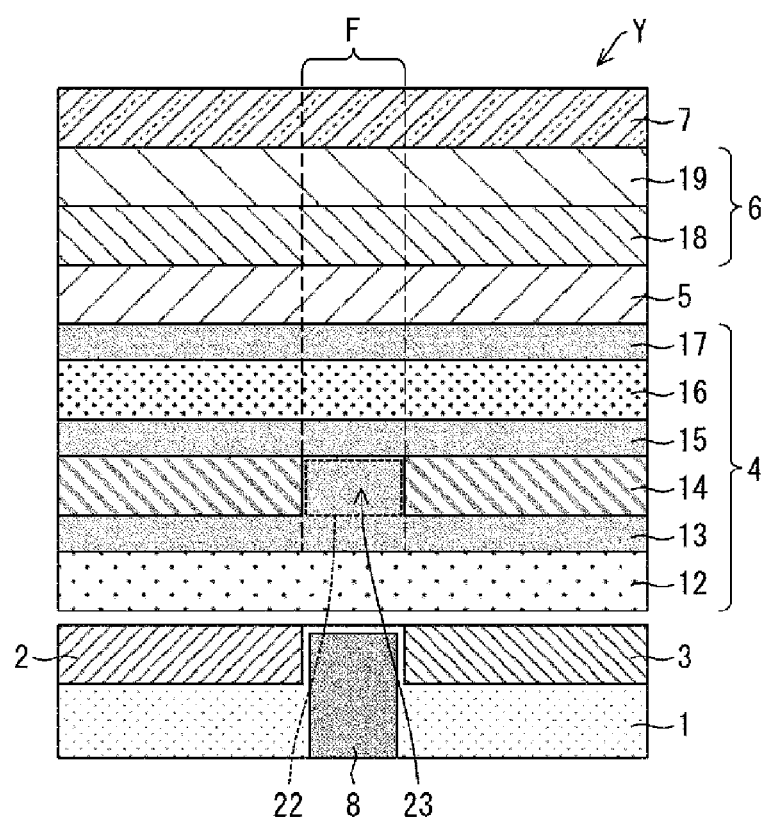
FIG. 6 is a diagram illustrating an example of a range Y illustrated in FIG. 1 in more detail.

FIG. 6 is a diagram illustrating an example of a range Y illustrated in FIG. 1 in more detail. The range Y illustrated in FIG. 6 differs from the range X illustrated in FIG. 4 in that the connection plate 8 is provided and the following.

In the range Y illustrated in FIG. 6, a single gap 23 is formed in an overlapping part 22, which is a part of the metal film 14 that overlaps with the bending part F. The adhesive layer 13 is provided so as to fill the space created by forming the gap 23.

Figure 7:
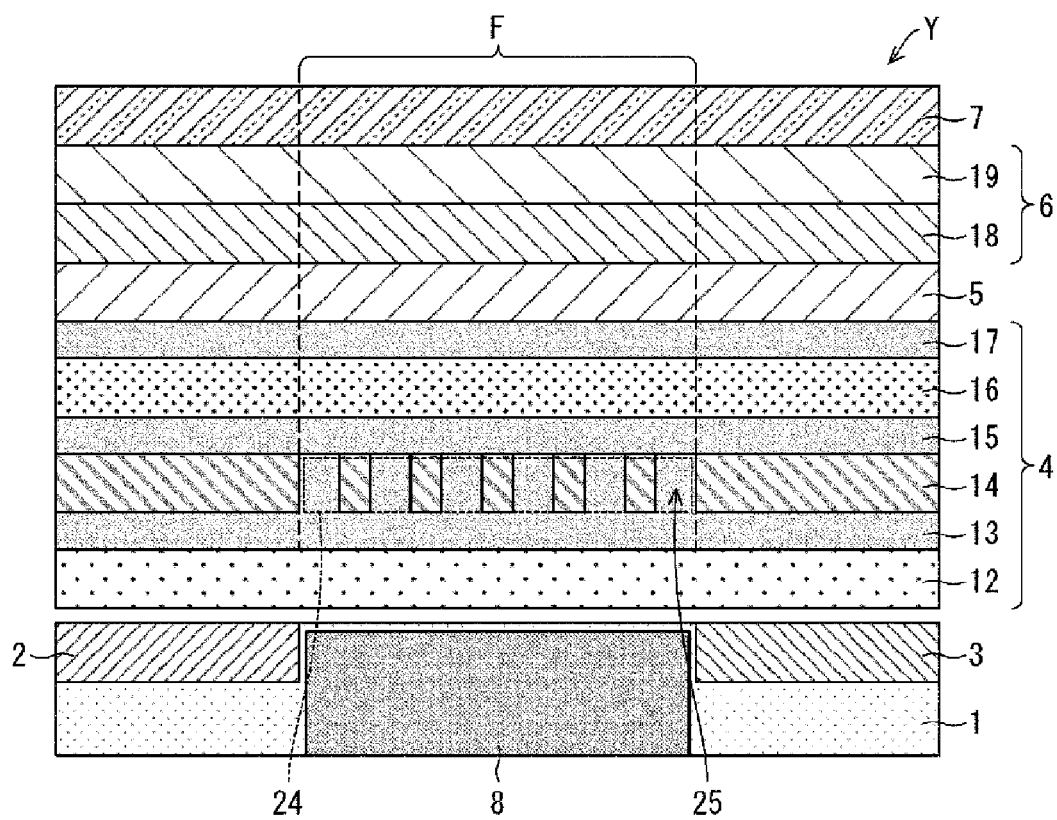
FIG. 7 is a diagram illustrating another example of the range Y illustrated in FIG. 1 in more detail.

FIG. 7 is a diagram illustrating another example of the range Y illustrated in FIG. 1 in more detail. The range Y illustrated in FIG. 7 differs from the range X illustrated in FIG. 4 in that the connection plate 8 is provided and the following.

In the range Y illustrated in FIG. 7, a plurality of gaps 25 are formed in an overlapping part 24, which is a part of the metal film 14 that overlaps with the bending part F. The adhesive layer 13 is provided so as to fill all of the plurality of spaces created by forming the plurality of gaps 25. Note that the adhesive layer 13 may not completely fill the gaps 25 due to variations in the process, and an air layer may be included.

The second moment of area of the overlapping part 24 is less than the second moment of area in the part of the metal film 14 other than the overlapping part 24. In other words, the second moment of area of the overlapping part 24 is less than the second moment of area of the part of the metal film 14 that overlaps with the first support substrate 2 and less than the second moment of area of the part of the metal film 14 that overlaps with the second support substrate 3. The second moment of area is a value representing how resistant the cross-sectional shape of a member is to bending, and can be said to be an amount representing the deformation resistance of a member with respect to a bending moment. Changing the cross-section of a member also changes the value of the second moment of area.

Figure 8:
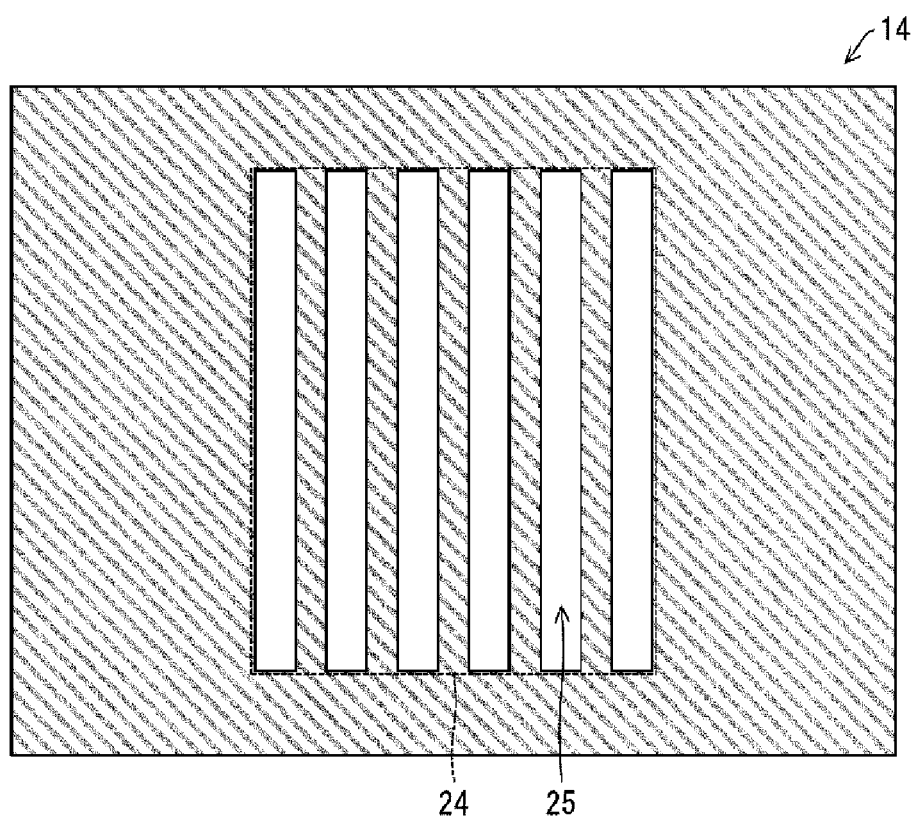
FIG. 8 is a plan view illustrating an example of a configuration of the metal film in which the gaps is formed.

FIG. 8 is a plan view illustrating an example of a configuration of the metal film 14 in which the gaps 25 is formed. In the metal film 14 illustrated in FIG. 8, the gaps 25 is formed in the overlapping part 24, and the gaps 25 is not formed outside of the overlapping part 24. In other words, the metal film 14 illustrated in FIG. 8 is configured as a single plate-like member in which the gaps 25 are formed in the overlapping part 24.

Figure 9:
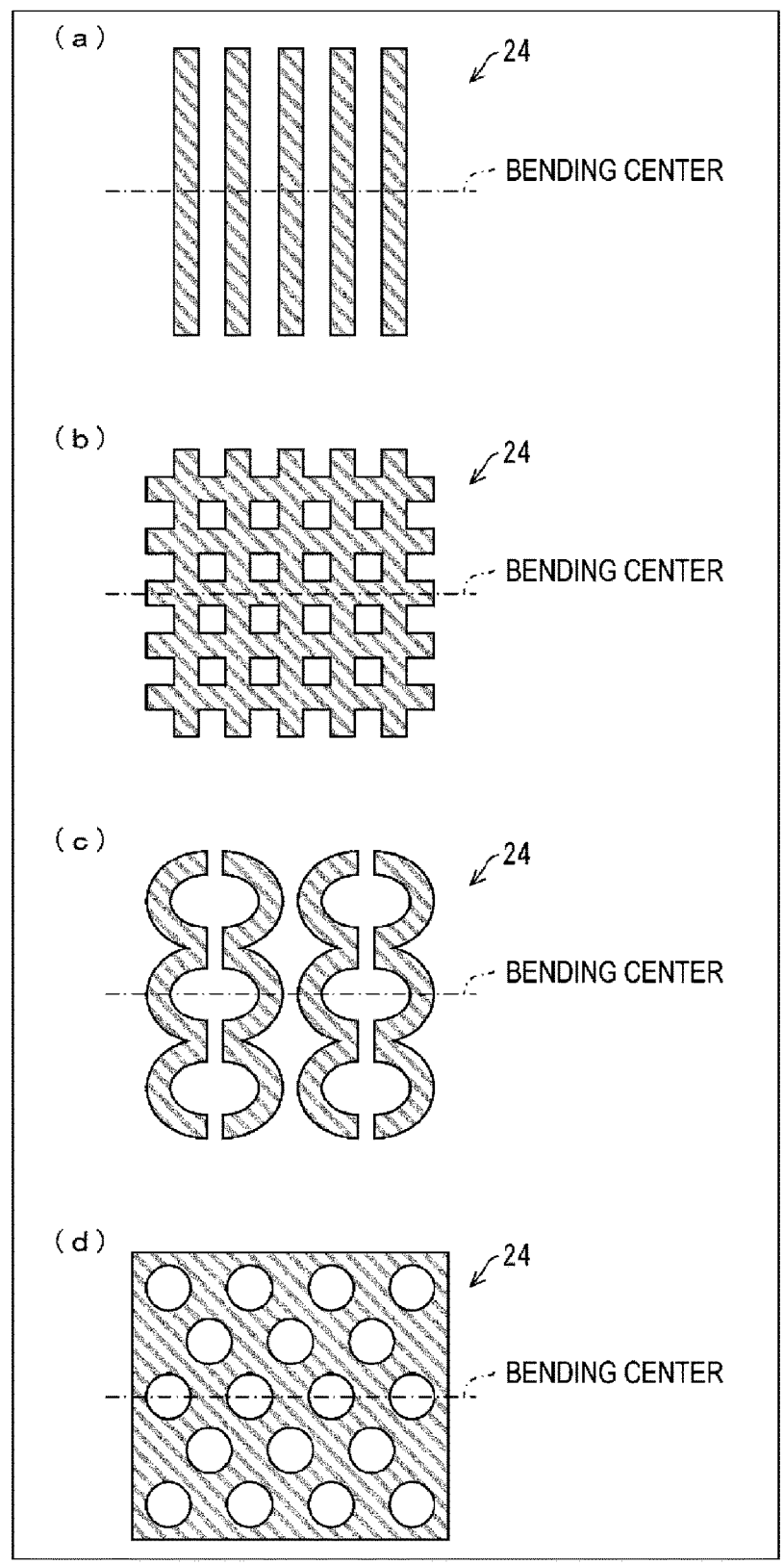
FIG. 9(*a*) is a plan view illustrating an example of a part of a metal film that overlaps with a bending part, and FIGS. 9(*b*) to 9(*d*) are plan views illustrating modified examples of FIG. 9(*a*).

(a) of FIG. 9 is a plan view illustrating an example of the overlapping part 24. (b) to (d) of FIG. 9 are plan views each illustrating a modified example of (a) of FIG. 9. For simplicity of illustration, parts other than the overlapping part 24 in the metal film 14 are omitted in (a) to (d) of FIG. 9.

The plan view of the overlapping part 24 illustrated in (a) of FIG. 9 coincides with the plan view of the foldable display 101. In a plan view of the overlapping part 24, the overlapping part 24 illustrated in (a) of FIG. 9 has a grating-like shape. In a plan view of the overlapping part 24, the overlapping part 24 may have a shape other than a grating-like shape, such as a lattice shape (see (b) of FIG. 9), a chain-like shape (see (c) of FIG. 9, in this example, a plurality of chain-like shapes), and a flat plate-shape with dot-like shapes cut out (see (d) of FIG. 9).

By giving the overlapping part 24 a grating-like shape, a lattice shape, or a chain-like shape in a plan view of the foldable display 101, it is possible to both suppress the occurrence of wrinkles in the bending part F and reinforce the bending part F.

Furthermore, not only the overlapping part 24, but also the entire surface of the metal film 14, may have a grating-like shape, a lattice shape, or a chain-like shape in a plan view of the foldable display 101 (in other words, in a plan view of the metal film 14). In this way as well, it is possible to both suppress the occurrence of wrinkles in the bending part F and reinforce the bending part F. This configuration is suitable when the overall size of the metal film 14 is small.

Third Embodiment

Figure 10:
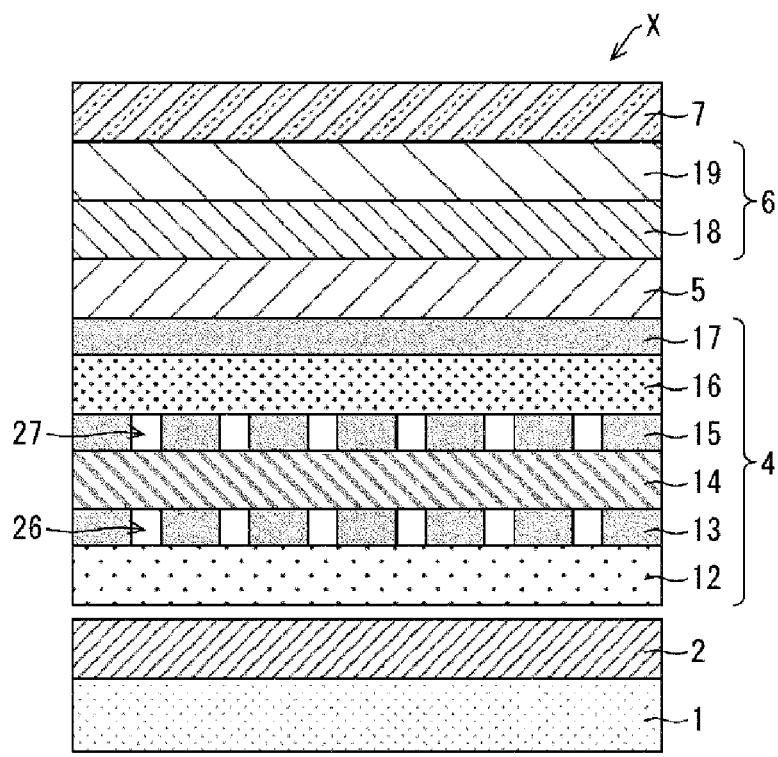
FIG. 10 is a diagram illustrating another example of the range X illustrated in FIG. 1 in more detail.

FIG. 10 is a diagram illustrating another example of the range X illustrated in FIG. 1 in more detail. The range X illustrated in FIG. 10 differs from the range X illustrated in FIG. 4 in the following.

A plurality of air layers 26 are formed throughout the adhesive layer 13. In other words, a plurality of gaps are formed in the adhesive layer 13, and air is present in each of the spaces created by forming these gaps.

A plurality of air layers 27 are formed throughout the adhesive layer 15. In other words, a plurality of gaps are formed in the adhesive layer 15, and air is present in each of the spaces created by forming these gaps.

Figure 11:
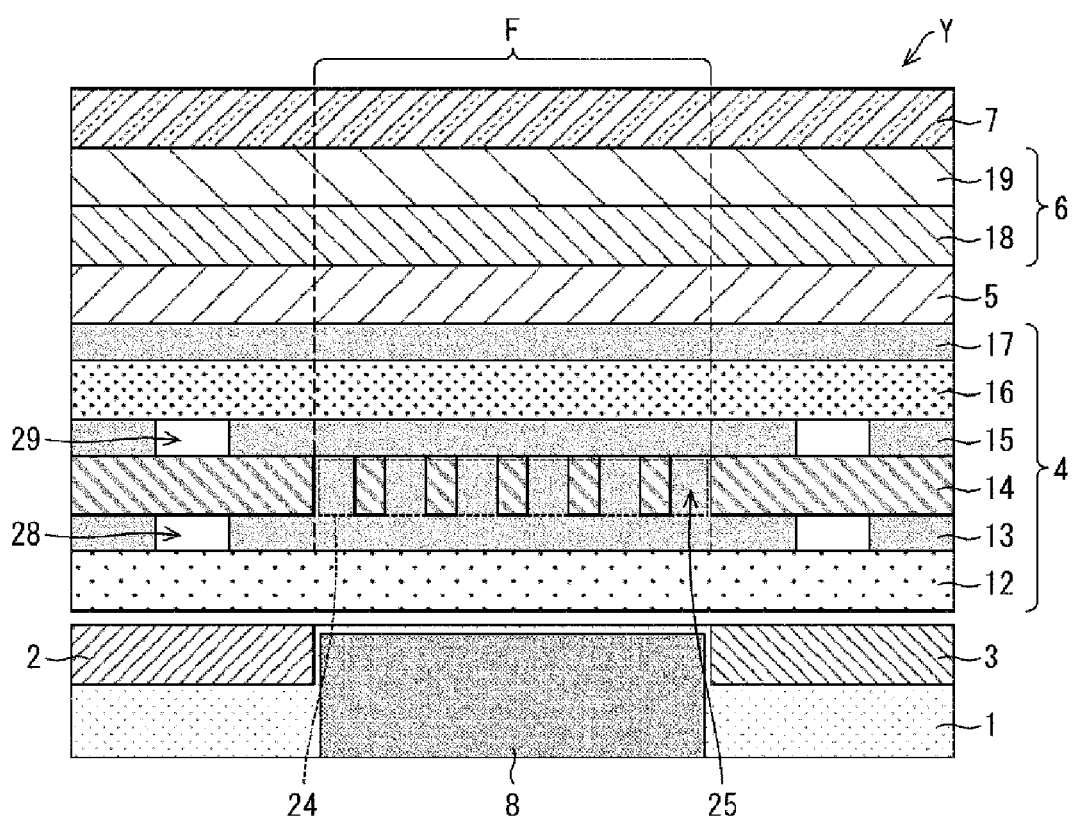
FIG. 11 is a diagram illustrating yet another example of the range Y illustrated in FIG. 1 in more detail.

FIG. 11 is a diagram illustrating yet another example of the range Y illustrated in FIG. 1 in more detail. The range Y illustrated in FIG. 11 differs from the range Y illustrated in FIG. 7 in the following.

A plurality of air layers 28 are formed in the adhesive layer 13 outside of the overlapping part 24 of the metal film 14. In other words, a plurality of gaps are formed in the adhesive layer 13, and air is present in each of the spaces created by forming these gaps.

A plurality of air layers 29 are formed in the adhesive layer 15 outside of the overlapping part 24 of the metal film 14. In other words, a plurality of gaps are formed in the adhesive layer 15, and air is present in each of the spaces created by forming these gaps.

Figure 12:
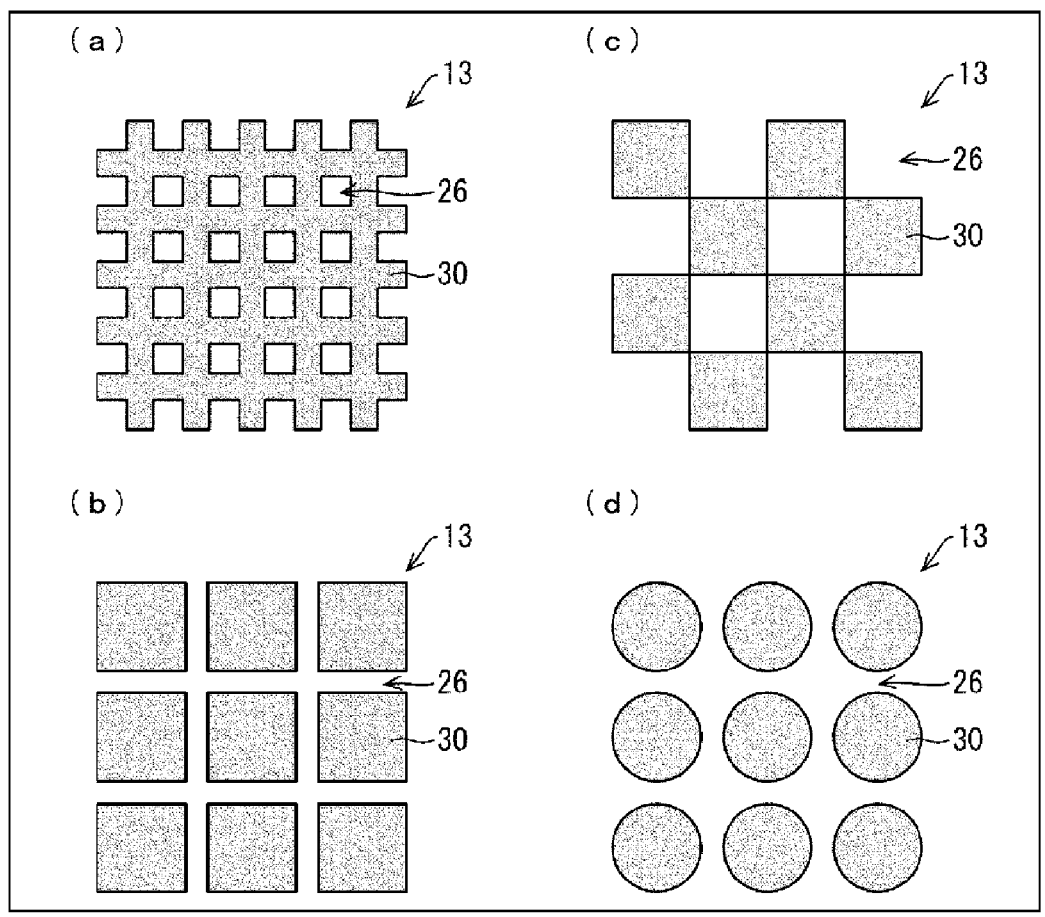
FIG. 12(*a*) is a plan view illustrating an example of an adhesive layer in which air layers are formed, and FIGS. 12(*b*) to 12(*d*) are plan views illustrating modified examples of FIG. 12(*a*).

(a) of FIG. 12 is a plan view illustrating an example of the adhesive layer 13 in which the air layers 26 are formed. (b) to (d) of FIG. 12 are plan views each illustrating a modified example of (a) of FIG. 12. For simplicity of illustration, parts other than the adhesive layer 13 are omitted in (a) to (d) of FIG. 12.

The adhesive layer 13 is constituted by an adhesive 30 and the air layers 26. The plan view of the adhesive layer 13 illustrated in (a) of FIG. 12 coincides with the plan view of the foldable display 101. In a plan view of the adhesive layer 13 illustrated in (a) of FIG. 12, the adhesive 30 has a lattice shape. In a plan view of the adhesive layer 13, the adhesive 30 may have a shape other than a lattice shape, such as a plurality of square shapes (see (b) of FIG. 12), a checkered shape (see (c) of FIG. 12), and a dot shape (see (d) of FIG. 12).

Because the air layers 26 are formed within the adhesive layer 13, the metal film 14 may vibrate when subjected to an impact. When the metal film 14 vibrates due to an impact, a portion of the potential energy from the impact is converted to kinetic energy. Thus, physical damage to the foldable display 101 can be effectively reduced.

This also holds for the combination of the adhesive layer 13 and the air layers 26, the combination of the adhesive layer 15 and the air layers 27, the combination of the adhesive layer 13 and the air layers 28, and the combination of the adhesive layer 15 and the air layers 29.

The adhesive layer 13 or the adhesive layer 15 may be an absorbing layer with a self-adhering function. The configuration in which the air layers 28 are formed in the adhesive layer 13 and/or the configuration in which the air layers 29 are formed in the adhesive layer 15 may be applied to the range Y illustrated in FIG. 6.

Fourth Embodiment

Figure 13:
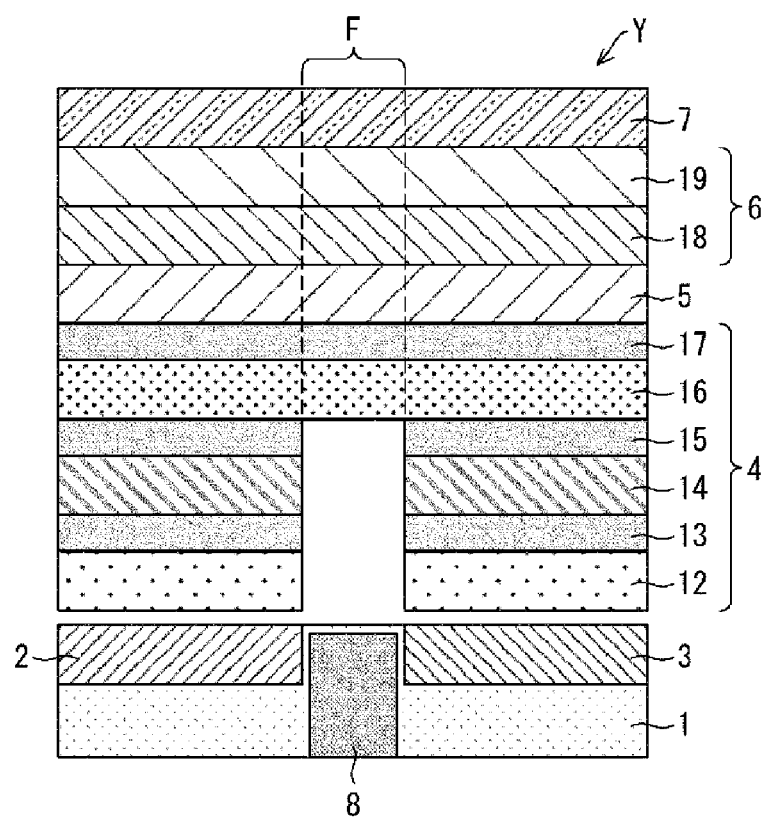
FIG. 13 is a diagram illustrating a modified example of the range Y illustrated in FIG. 6.

FIG. 13 is a diagram illustrating a modified example of the range Y illustrated in FIG. 6. The range Y illustrated in FIG. 13 differs from the range Y illustrated in FIG. 6 in that the plastic film 12, the adhesive layer 13, the metal film 14, and the adhesive layer 15 are not provided in the bending part F and are each separated into a plurality (two in this example) provided on either side of the bending part F.

Figure 14:
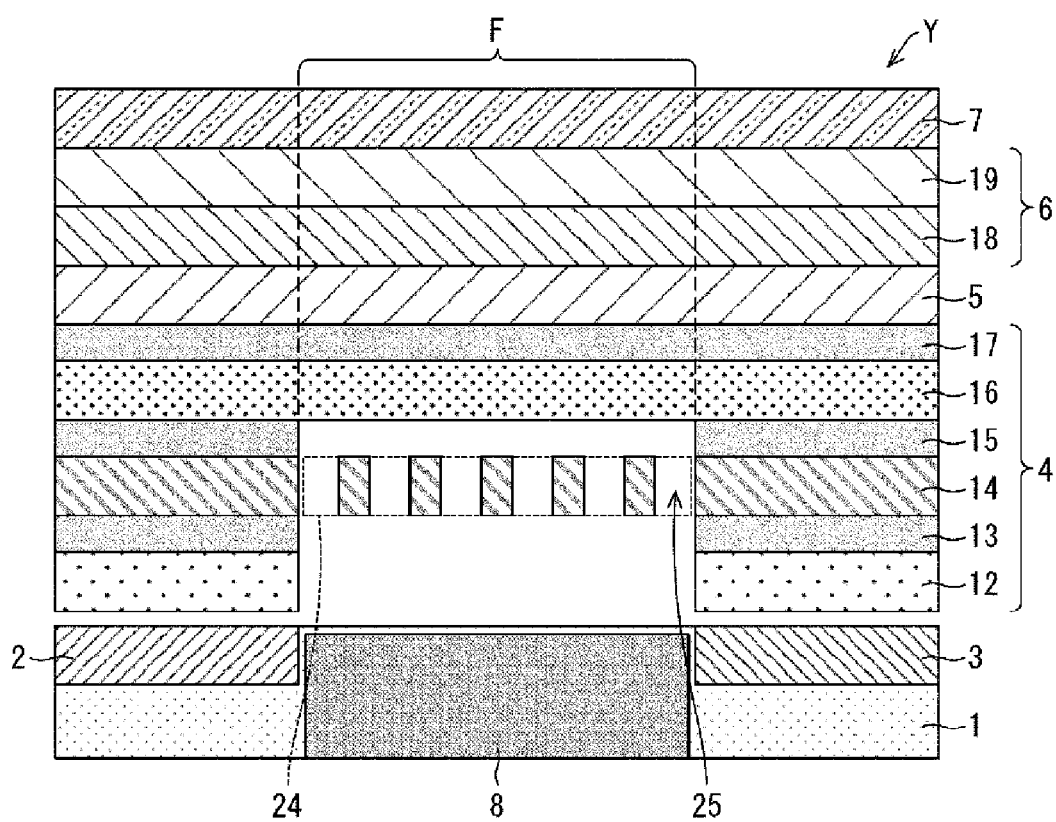
FIG. 14 is a diagram illustrating a modified example of the range Y illustrated in FIG. 7.

FIG. 14 is a diagram illustrating a modified example of the range Y illustrated in FIG. 7. The range Y illustrated in FIG. 14 differs from the range Y illustrated in FIG. 7 in that the plastic film 12, the adhesive layer 13, and the adhesive layer 15 are not provided in the bending part F and are each separated into a plurality (two in this example) provided on either side of the bending part F.

Figure 15:
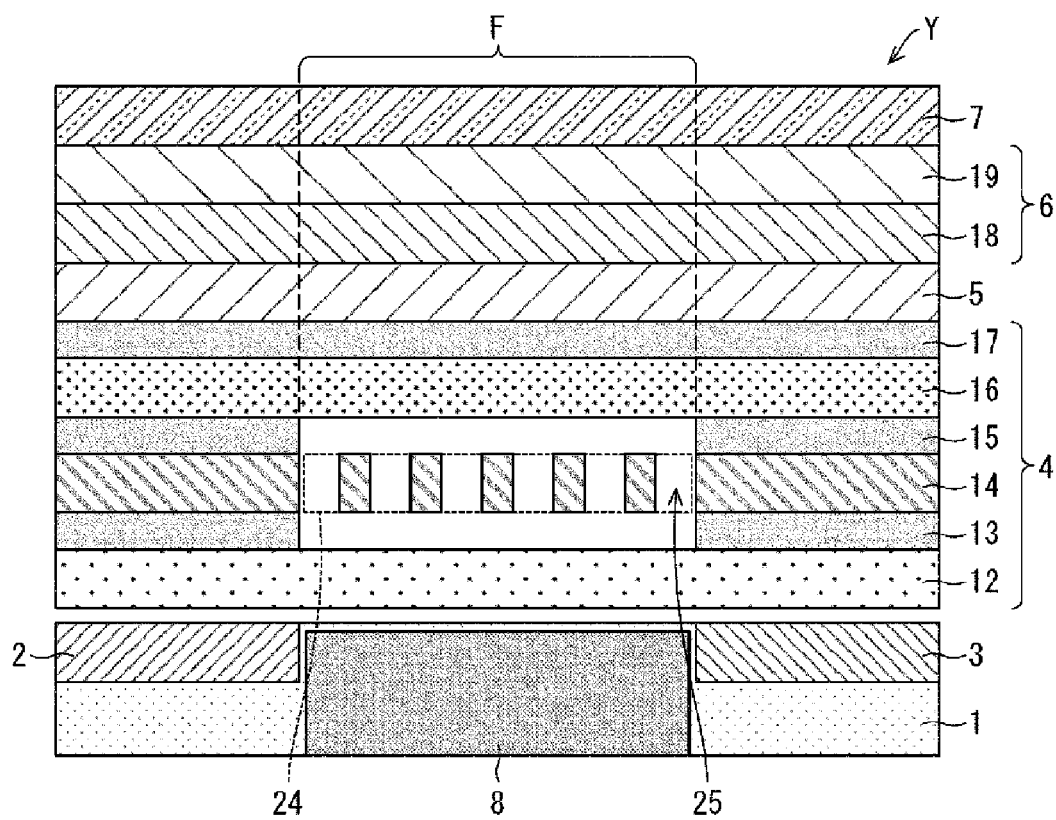
FIG. 15 is a diagram illustrating a modified example of the range Y illustrated in FIG. 14.

FIG. 15 is a diagram illustrating a modified example of the range Y illustrated in FIG. 14. The range Y illustrated in FIG. 15 differs from the range Y illustrated in FIG. 14 in that the plastic film 12 is provided in the bending part F.

According to each of the above-described configurations, the members located in the bending part F can be reduced, thus allowing the bending part F to easily bend.

Test Results 1

Figures 16, 17:
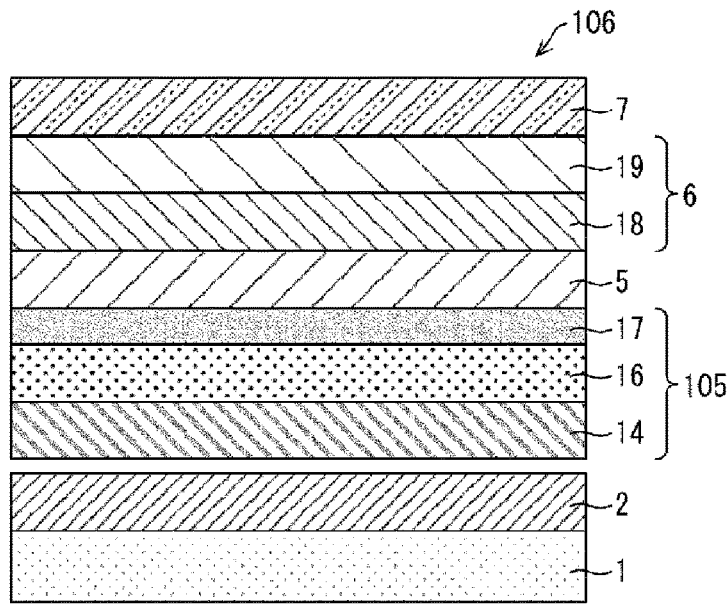
FIG. 16 is a table showing the thickness of each member constituting the shock absorbing layer of the foldable display illustrated in FIG. 1 and the results of the shock absorption testing.
FIG. 17 is a diagram illustrating a schematic configuration of a part of a foldable display provided with a shock absorbing layer of a comparative example.

FIG. 16 is a table showing the thickness of each member constituting the shock absorbing layer 4 of the foldable display 101 and the results of the shock absorption testing. Note that the specific configuration of the shock absorbing layer 4 is based on the above-described first embodiment.

First, the vertical axis (except for the horizontal axis item "falling ball test result of a 100 g stainless steel ball") will be described. Item "member" indicates the members that constitute the shock absorbing layer 4. The item "thickness ($\mu$m)" indicates a range of the thickness (unit: $\mu$m) for the member indicated by the item "member". The item "shock absorbing structure" indicates whether the member is provided "yes" or not provided "no". Furthermore, the meaning of the entries other than "yes" and "no" is as follows. In a case in which the member is provided but the thickness is a value important to note such as a value outside of the range indicated in the item "thickness ($\mu$m)" the thickness is indicated in the item "shocking absorbing structure". In addition, in a case in which the metal film 14 is replaced with a glass film, "yes" is indicated in the item "shock absorbing structure" together with "glass".

Next, the horizontal axis item "falling ball test result of a 100 g stainless steel ball" will be described. This item shows the results of a test in which the foldable display 101 is placed with the cover 7 side upward and a stainless steel ball with a weight of 100 g is dropped from above and impacted against the cover 7. For the test results, in a case where there is no display defect in the foldable display 101, "OK" is indicated, in a case in which there is a display defect in the foldable display 101, "NG" is indicated. Additionally, in conjunction with the "OK" or "NG" entry, the drop distance of the stainless steel ball (height of the start position of the drop motion of the stainless steel ball with respect to the top surface of the foldable display 101) is indicated.

According to FIG. 16, it can be seen that by the plastic film 16, the plastic film 12, and the metal film 14 being provided, the shock absorbing layer 4 having excellent shock absorbing performance can be achieved.

Test Results 2

FIG. 17 is a diagram illustrating a schematic configuration of a part of a foldable display 106 provided with a shock absorbing layer 105 of a Comparative example. The foldable display 106 of the comparative example has the same configuration as the foldable display 101 according to the first embodiment described above except that instead of the shock absorbing layer 4, the shock absorbing layer 105 according to the comparative example is provided. The shock absorbing layer 105 of the comparative example is similar to the shock absorbing layer 4 according to the first embodiment described above in that it includes the metal film 14, the plastic film 16, and the adhesive layer 17, but differs from the shock absorbing layer 4 according to first embodiment described above in that the shock absorbing layer 105 does not include the plastic film 12, the adhesive layer 13, and the adhesive layer 15. In the shock absorbing layer 105 of the comparative example, the metal film 14, the plastic film 16, and the adhesive layer 17 are layered in this order.

FIG. 18 is a table showing the thickness of the metal film 14 constituting the shock absorbing layer 105 of samples 1 to 5 of the foldable display 106 of the comparative example illustrated in FIG. 17 and the results of the shock absorption testing. The test methods and results of the shock absorption testing shown in FIG. 18 and FIGS. 19 to 22 described below are similar to that in FIG. 16. In the samples 1 to 5 and the samples 6 to 27 described below, the adhesive layer 17 is an acrylic adhesive having a thickness of from 5 μm to 50 μm, the plastic film 16 is a polyester film having a thickness of from 15 μm to 100 μm, and the metal film 14 is a stainless steel plate. Note that there may be a slight amount of air between the metal film 14 and the plastic film 16.

The horizontal axis item "thickness of the metal film 14" indicates the thickness of the stainless steel plate used as the metal film 14. Note that for the stainless steel plate with a thickness of 100 μm, two stacked stainless steel plates with a thickness of 50 μm are used, as opposed to a single stainless steel plate with a thickness of 100 μm. For the stainless steel plates having a thickness of 200 μm, 300 μm, and 400 μm, a single stainless steel plate is used.

According to FIG. 18, it can be seen that the thickness of the metal film 14 is preferably 100 μm or less.

Test Results 3

FIG. 19 is a table showing the material and the thickness of each member constituting the shock absorbing layer 4 of the samples 6 to 9 of the foldable display 101 and the results of the shock absorption testing. Note that the specific configuration of the shock absorbing layer 4 is based on the above-described first embodiment.

According to FIG. 19, it can be seen that the thickness of the metal film 14 is preferable 30 μm compared to 50 μm. Furthermore, it can be seen that for the combination of the adhesive layer 13 and the plastic film 12, a combination of a silicon adhesive with a thickness of 25 μm and a polyester film with a thickness of 50 μm is preferable compared to a combination of an acrylic adhesive with a thickness of 15 μm and an urethane film with a thickness of 90 μm.

Test Results 4

FIG. 20 is a table showing the material and thickness of the adhesive layer 13 and the adhesive layer 15 constituting the shock absorbing layer 4 of the samples 10 to 17 of the foldable display 101, the storage modulus and the loss modulus of the adhesive layer 15, the results of the shock absorption testing, and the determination of the results of the shock absorption testing. Note that the specific configuration of the shock absorbing layer 4 is based on the above-described first embodiment.

The storage modulus and the loss modulus of the adhesive layer 15 are measured by applying a 5 Hz vibration at 20 degrees Celsius. The determination of the result of the shock absorption testing is indicated as "excellent" when a maximum fall distance of 60 cm or greater was passed, is indicated as "good" when a maximum fall distance from 30 cm to less than 60 cm was passed, is indicated as "marginal" when a maximum fall distance from 5 cm to less than 30 cm was passed, and is indicated as "poor" when a maximum fall distance of less than 5 cm was passed (including cases where the falling ball test resulted in all fails).

In the samples 10 to 17 illustrated in FIG. 20 and the samples 18 to 23 illustrated in FIG. 21 described below, the "acrylic 1" to "acrylic 6" of the material of the adhesive layer 13 and the adhesive layer 15 are adhesives with an acrylic resin as a main component, but because the compositions thereof differ from one another, the storage modulus and the loss modulus differ. Also, in the samples 10 to 23, the plastic film 12 is a urethane film with a thickness of from 50 μm to 100 μm, the metal film 14 is a stainless steel plate with a thickness of 30 μm, and the plastic film 16 is a polyester film having a thickness of from 15 μm to 100 μm as described above.

Referring to FIG. 20, it can be seen that the storage modulus of the adhesive layer 15 is preferably from 0.04 MPa to 4.5 MPa, and more preferably from 0.2 MPa to 4.5 MPa. Also, it can be seen that the loss modulus of the adhesive layer 15 is preferably from 0.03 MPa to 1.5 MPa, and more preferably from 0.2 MPa to 1.5 MPa. In addition, it can be seen that the lower the thickness of the adhesive layer 15, the greater the fall resistance. Furthermore, it can be seen that the thickness of the adhesive layer 15 is preferably from 1 μm to 15 μm, and more preferably from 1 μm to 10 μm.

Test Results 5

FIG. 21 is a table showing the material and thickness of the adhesive layer 13 and the adhesive layer 15 constituting the shock absorbing layer 4 of the samples 18 to 23 of the foldable display 101, the storage modulus and the loss modulus of the adhesive layer 13, the results of the shock absorption testing, and the determination of the results of the shock absorption testing. Note that the specific configuration of the shock absorbing layer 4 is based on the above-described first embodiment.

The storage modulus and the loss modulus of the adhesive layer 13 are measured by applying a 5 Hz vibration at 20 degrees Celsius. The entries for the determination of the results of the shock absorption testing shown in FIG. 21 is the same as that in FIG. 20.

Referring to FIG. 21, it can be seen that the storage modulus of the adhesive layer 13 is preferably from 0.04

MPa to 0.8 MPa. Also, it can be seen that the loss modulus of the adhesive layer 13 is preferably from 0.03 MPa to 1.5 MPa. Furthermore, it can be seen that the thickness of the adhesive layer 13 is preferably from 1 μm to 25 μm, and more preferably from 1 μm to 10 μm. Also, it can be seen that the material of the adhesive layer 13 is preferably an adhesive with an acrylic resin as a main component.

Test Results 6

FIG. 22 is a table showing the material, the thickness, the surface treatment, and the Vickers hardness of the metal film 14 constituting the shock absorbing layer 4 of the samples 24 to 27 of the foldable display 101 and the results of the shock absorption testing in a case in which the fall distance is 20 cm and a case in which the fall distance is 25 cm. Note that the specific configuration of the shock absorbing layer 4 is based on the above-described first embodiment.

In the table shown in FIG. 22, as the result of the shock absorption testing, the presence or absence of a recess is also indicated in addition to the presence or absence of a display defect. The presence or absence of a recess is indicated as "OK" in a case in which there is no visually detectable recess, and in a case in which there is a visually detectable recess, a recess portion with a diameter of 2 mm or less is indicated as "minute" and a recess portion with a diameter of 5 mm or greater is indicated as "large". Note that there were no samples in which a recess was formed with a recess portion diameter of greater than 2 mm and less than 5 mm.

In the samples 24 to 27 illustrated in FIG. 22, the adhesive layer 13 and the adhesive layer 15 are acrylic adhesives having the same thickness of 2 μm, and the plastic film 12 is a urethane film with the same thickness of 90 μm. Furthermore, "SUS301" and "SUS304" of the material of the metal film 14 are stainless steel having different compositions from one another. Furthermore, the "satin process" and "glossy finish" indicated in the surface treatment of the metal film 14 are different surface treatments, and "-" indicates that surface treatment has not been performed. Satin process is a type of process that roughens a surface by forming fine recesses and protrusions on the surface, and glossy finish is a type of finish that gives a surface a mirror-like finish.

Referring to FIG. 22, it can be seen that the Vickers hardness of the metal film 14 is preferably 350 HV or greater, and more preferably 500 HV or greater.

Supplement

A foldable display according to a first aspect of the disclosure includes: a display layer with flexibility including a first display region, a second display region, and a third display region located between the first display region and the second display region; a cover with flexibility configured to cover the display layer; a first support substrate with inflexibility configured to support the first display region; a second support substrate with inflexibility configured to support the second display region; a bending part capable of bending including the third display region; and a shock absorbing layer provided between the display layer and the first support substrate and between the display layer and the second support substrate.

According to the configuration described above, when a localized impact is applied to the foldable display, the shock is dispersed and absorbed by the shock absorbing layer. As a result, the strength of the shock that the display layer actually receives due to the impact is minimized. Accordingly, the occurrence of a display defect caused by a failure of the display layer or bright spot or black spot display defect of the display by the display layer can be reduced.

The foldable display according to a second aspect of the disclosure has the configuration of the first aspect, wherein the shock absorbing layer includes a first plastic film (the plastic film 16), a second plastic film (the plastic film 12) provided on an opposite side to the display layer as seen from the first plastic film, and a metal film provided between the first plastic film and the second plastic film.

According to the configuration described above, a shock absorbing layer having excellent shocking absorbing performance can be achieved.

The foldable display according to a third aspect of the disclosure has the configuration of the second aspect, wherein a second moment of area of a part (overlapping part 24) of the metal film that overlaps the bending part is less than a second moment of area of a part of the metal film that overlaps the first support substrate and is less than a second moment of area of a part of the metal film that overlaps the second support substrate.

The foldable display according to a fourth aspect of the disclosure has the configuration of the third aspect, wherein in a plan view of the foldable display, the part of the metal film that overlaps the bending part has a grating-like shape, a lattice shape, or a chain-like shape.

The foldable display according to the fifth aspect of the disclosure has the configuration of the fourth aspect, wherein in a plan view of the foldable display, the metal film in entirety has a grating-like shape, a lattice shape, or a chain-like shape.

The configuration described above is suitable when the overall size of the metal film is small.

The foldable display according to the sixth aspect of the disclosure has the same configuration as any one of the two to fifth aspects, wherein the shock absorbing layer includes an adhesive layer provided at least one of between the first plastic film and the metal film or between the second plastic film and the metal film.

The foldable display according to the seventh aspect of the disclosure has the same configuration as the sixth aspect, wherein an air layer is formed inside the adhesive layer.

According to the configuration described above, because the air layers are formed within the adhesive layer, the metal film may vibrate when subjected to an impact. When the metal film vibrates due to an impact, a portion of the potential energy from the impact is converted to kinetic energy. Thus, physical damage to the foldable display can be effectively reduced.

The foldable display according to the eighth aspect of the disclosure has the same configuration as the sixth or seventh aspect, wherein at least the adhesive layer is separated into a plurality located on either side of the bending part.

According to each of the above-described configurations, the members located in the bending part can be reduced, thus allowing the bending part to easily bend.

The foldable display according to the ninth aspect of the disclosure has the same configuration as any one of the sixth to eighth aspects, wherein the adhesive layer includes a first adhesive layer provided between the first plastic film and the metal film and a second adhesive layer provided between the second plastic film and the metal film, a storage modulus of the first adhesive layer is from 0.2 MPa to 4.5 MPa, a loss modulus of the first adhesive layer is from 0.2 MPa to 4.5 MPa, and a thickness of the first adhesive layer is from 1 μm to 10 μm.

The foldable display according to the tenth aspect of the disclosure has the same configuration as any one of the sixth to ninth aspects, wherein the adhesive layer includes a first adhesive layer provided between the first plastic film and the metal film and a second adhesive layer provided between the second plastic film and the metal film, a storage modulus of the second adhesive layer is from 0.04 MPa to 0.8 MPa, and a loss modulus of the second adhesive layer is from 0.03 MPa to 0.5 MPa.

The foldable display according to the eleventh aspect of the disclosure has the same configuration as any one of the sixth to tenth aspect, wherein the adhesive layer includes a first adhesive layer provided between the first plastic film and the metal film and a second adhesive layer provided between the second plastic film and the metal film, and a Vickers hardness of the metal film is 500 HV or greater.

The foldable display according to the twelfth aspect of the disclosure has the same configuration as any one of the second to eleventh aspect, wherein the metal film includes at least one of stainless steel, aluminum, or copper.

The foldable display according to the thirteenth aspect of the disclosure has the same configuration as any one of the second to twelfth aspect, wherein a thickness of the metal film is from 10 μm to 100 μm.

The foldable display according to the fourteenth aspect of the disclosure has the same configuration as any one of the second to thirteenth aspect, wherein the first plastic film includes at least one of polyimide, PET, PEN, COC, or aramid.

The foldable display according to the fifteenth aspect of the disclosure has the same configuration as any one of the second to fourteenth aspect, wherein the second plastic film includes at least one of PET, urethane resin, polyester resin, acrylic resin, or polycarbonate resin.

The foldable display according to the sixteenth aspect of the disclosure has the same configuration as any one of the second to fifteenth aspect, wherein a Young's modulus of the first plastic film is greater than a Young's modulus of the second plastic film.

The foldable display according to the seventeenth aspect of the disclosure has the same configuration as any one of the second to sixteenth aspect, wherein a thickness of the first plastic film is greater than a thickness of the metal film, and a thickness of the second plastic film is equal to or greater than a thickness of the first plastic film.

The foldable display according to the eighteenth aspect of the disclosure has the same configuration as any one of the second to seventeenth aspect, wherein the second plastic film is a layered structure including a plurality of layers made of different materials.

The foldable display according to the nineteenth aspect of the disclosure has the same configuration as any one of the second to eighteenth aspect, wherein a Young's modulus of the first plastic film is from 1 GPa to 10 GPa.

According to the configuration described above, the impact received by the metal film can be sufficiently dampened, reducing the likelihood that the metal film cannot sufficiently disperse the shock.

The foldable display according to the twentieth aspect of the disclosure has the same configuration as any one of the second to nineteenth aspect, further including a thermal diffusion function layer provided on the second plastic film side as seen from the metal film.

According to the configuration described above, heat damage to the light-emitting element of the display layer can be suppressed due to the thermal diffusion (heat dissipation), and the lifespan of the foldable display can be extended.

The foldable display according to the twenty-first aspect of the disclosure has the same configuration as any one of the first to twentieth aspect, further including a touch panel provided between the display layer and the cover.

According to the configuration described above, in the foldable display, a touch panel function associated with display by the display layer can be achieved.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A foldable display, comprising:
   a display layer with flexibility including a first display region, a second display region, and a third display region located between the first display region and the second display region;
   a cover with flexibility configured to cover the display layer;
   a first support substrate with inflexibility configured to support the first display region;
   a second support substrate with inflexibility configured to support the second display region;
   a bending part capable of bending including the third display region; and
   a shock absorbing layer provided between the display layer and the first support substrate and between the display layer and the second support substrate,
   wherein the shock absorbing layer includes
      a first plastic film,
      a second plastic film provided on an opposite side to the display layer as seen from the first plastic film, and
      a metal film provided between the first plastic film and the second plastic film.

2. The foldable display according to claim 1, wherein a second moment of area of a part of the metal film that overlaps the bending part is less than a second moment of area of a part of the metal film that overlaps the first support substrate and is less than a second moment of area of a part of the metal film that overlaps the second support substrate.

3. The foldable display according to claim 2, wherein in a plan view of the foldable display, the part of the metal film that overlaps the bending part has a grating-like shape, a lattice shape, or a chain-like shape.

4. The foldable display according to claim 3, wherein in a plan view of the foldable display, the metal film in entirety has a grating-like shape, a lattice shape, or a chain-like shape.

5. The foldable display according to claim 1, wherein the shock absorbing layer includes an adhesive layer provided at least one of between the first plastic film and the metal film or between the second plastic film and the metal film.

6. The foldable display according to claim 5, wherein an air layer is formed inside the adhesive layer.

7. The foldable display according to claim 5, wherein at least the adhesive layer is separated into a plurality located on either side of the bending part.

8. The foldable display according to claim 5,
wherein the adhesive layer includes a first adhesive layer provided between the first plastic film and the metal film and a second adhesive layer provided between the second plastic film and the metal film,
a storage modulus of the first adhesive layer is from 0.2 MPa to 4.5 MPa,
a loss modulus of the first adhesive layer is from 0.2 MPa to 4.5 MPa, and
a thickness of the first adhesive layer is from 1 μm to 10 μm.

9. The foldable display according to claim 5,
wherein the adhesive layer includes a first adhesive layer provided between the first plastic film and the metal film and a second adhesive layer provided between the second plastic film and the metal film,
a storage modulus of the second adhesive layer is from 0.04 MPa to 0.8 MPa, and
a loss modulus of the second adhesive layer is from 0.03 MPa to 0.5 MPa.

10. The foldable display according to claim 5,
wherein the adhesive layer includes a first adhesive layer provided between the first plastic film and the metal film and a second adhesive layer provided between the second plastic film and the metal film, and
a Vickers hardness of the metal film is 500 HV or greater.

11. The foldable display according to claim 1,
wherein the metal film includes at least one of stainless steel, aluminum, or copper.

12. The foldable display according to claim 1,
wherein a thickness of the metal film is from 10 μm to 100 μm.

13. The foldable display according to claim 1,
wherein the first plastic film includes at least one of polyimide, PET, PEN, COC, or aramid.

14. The foldable display according to claim 1,
wherein the second plastic film includes at least one of PET, urethane resin, polyester resin, acrylic resin, or polycarbonate resin.

15. The foldable display according to claim 1,
wherein a Young's modulus of the first plastic film is greater than a Young's modulus of the second plastic film.

16. The foldable display according to claim 1,
wherein a thickness of the first plastic film is greater than a thickness of the metal film, and
a thickness of the second plastic film is equal to or greater than a thickness of the first plastic film.

17. The foldable display according to claim 1,
wherein the second plastic film is a layered structure including a plurality of layers made of different materials.

18. The foldable display according to claim 1,
wherein a Young's modulus of the first plastic film is from 1 GPa to 10 GPa.

19. The foldable display according to claim 1, further comprising:
a thermal diffusion function layer provided on the second plastic film side as seen from the metal film.

20. The foldable display according to claim 1, further comprising:
a touch panel provided between the display layer and the cover.

* * * * *